(12) United States Patent
Goh et al.

(10) Patent No.: US 11,587,844 B2
(45) Date of Patent: Feb. 21, 2023

(54) ELECTRONIC DEVICE PACKAGE ON PACKAGE (POP)

(71) Applicant: Intel Corporation, Santa Clara, CA (US)

(72) Inventors: Eng Huat Goh, Ayer Itam (MY); Jiun Hann Sir, Gelugor (MY); Min Suet Lim, Bayan Lepas (MY); Xi Guo, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 544 days.

(21) Appl. No.: 16/306,884

(22) PCT Filed: Jul. 2, 2016

(86) PCT No.: PCT/US2016/040908
§ 371 (c)(1),
(2) Date: Dec. 3, 2018

(87) PCT Pub. No.: WO2018/009168
PCT Pub. Date: Jan. 11, 2018

(65) Prior Publication Data
US 2021/0035880 A1    Feb. 4, 2021

(51) Int. Cl.
*H01L 23/367* (2006.01)
*H01L 21/48* (2006.01)
(Continued)

(52) U.S. Cl.
CPC ........ *H01L 23/367* (2013.01); *H01L 21/4871* (2013.01); *H01L 23/49816* (2013.01); *H01L 23/49838* (2013.01); *H01L 25/0652* (2013.01)

(58) Field of Classification Search
CPC ........... H01L 23/12–14; H01L 21/4871; H01L 21/4882; H01L 23/34; H01L 2225/1094
See application file for complete search history.

(56) References Cited

U.S. PATENT DOCUMENTS 5,222,014 A    6/1993  Lin
5,571,593 A *  11/1996 Arldt ................... H05K 3/4069
                                                  428/209
(Continued)

OTHER PUBLICATIONS

PCT Application No. PCT/US2016/040908, Filing date Jul. 2, 2016; Eng Hust Eh Goh, International Search Report; dated Mar. 29, 2017; 13 Pages.

*Primary Examiner* — Tucker J Wright
(74) *Attorney, Agent, or Firm* — Schwabe, Williamson & Wyatt, P.C.

(57) ABSTRACT

Electronic device package on package (POP) technology is disclosed. A POP can comprise a first electronic device package including a heat source. The POP can also comprise a second electronic device package disposed on the first electronic device package. The second electronic device package can include a substrate having a heat transfer portion proximate the heat source that facilitates heat transfer from the heat source through a thickness of the substrate. The substrate can also have an electronic component portion at least partially about the heat transfer portion that facilitates electrical communication. In addition, the POP can comprise an electronic component operably coupled to the electronic component portion.

19 Claims, 5 Drawing Sheets

(51) Int. Cl.
*H01L 23/498* (2006.01)
*H01L 25/065* (2023.01)

(56) References Cited

U.S. PATENT DOCUMENTS

| | | | | |
|---|---|---|---|---|
| 5,734,555 | A | * | 3/1998 | McMahon ........... H05K 7/1084 257/713 |
| 5,751,063 | A | * | 5/1998 | Baba ....................... H01L 23/36 257/685 |
| 2013/0093073 | A1 | | 4/2013 | Chen et al. |
| 2014/0084446 | A1 | * | 3/2014 | Park ..................... H01L 23/552 257/712 |
| 2015/0054148 | A1 | | 2/2015 | Jang et al. |
| 2016/0270261 | A1 | * | 9/2016 | Matsuda .............. G11B 33/124 |
| 2016/0276308 | A1 | | 9/2016 | Min et al. |

\* cited by examiner

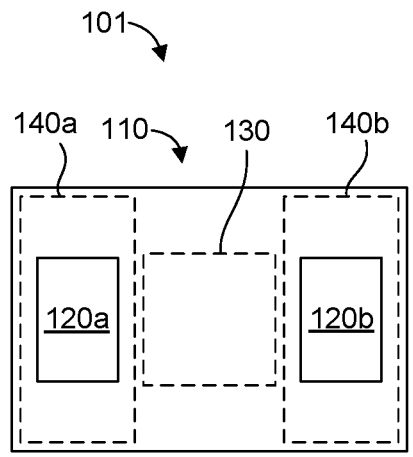
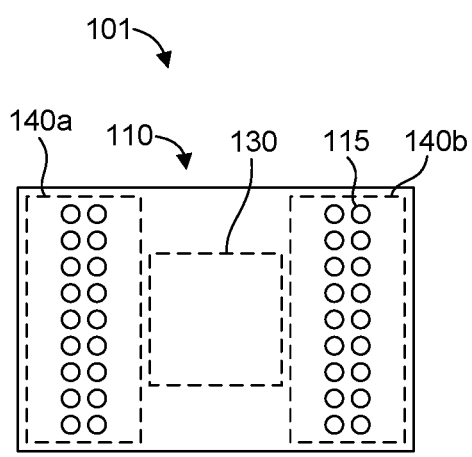
*FIG. 4A*    *FIG. 4B*
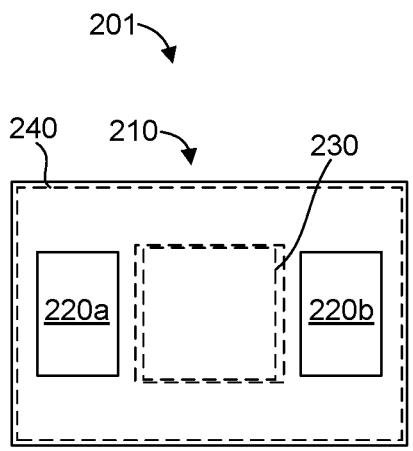
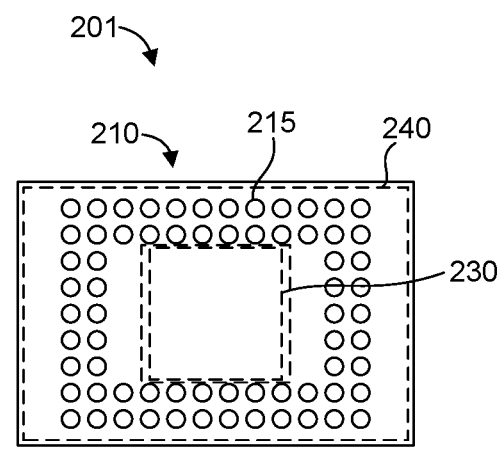
*FIG. 5A*    *FIG. 5B*

ID device packages and package on package (POP) stacks, and more particularly to cooling components of such POP stacks.

ELECTRONIC DEVICE PACKAGE ON PACKAGE (POP)

PRIORITY INFORMATION

This application is a 371 U.S. national stage entry of PCT Application Serial No. PCT/US2016/040908, filed Jul. 2, 2016, which is incorporated herein by reference in its entirety.

TECHNICAL FIELD

Embodiments described herein relate generally to electronic device packages and package on package (POP) stacks, and more particularly to cooling components of such POP stacks.

BACKGROUND

POP integrated circuit packaging is where two or more packages are stacked on a PCB. This arrangement provides a space savings on the PCB and has therefore become increasingly popular for small form factor applications due to the higher component density that can be provided in devices such as mobile phones, personal digital assistants (PDA), and digital cameras. Some POP configurations stack a memory package (e.g., DRAM, SRAM, FLASH, etc.) on a logic or processor package and are known as mixed logic-memory stacks. A logic or processor package can include processor and/or a system on a chip (SOC), which may integrate a CPU, a GPU, a memory controller, a video decoder, an audio decoder, a video encoder, a camera processor, system memory, and/or a modem onto a single chip.

BRIEF DESCRIPTION OF THE DRAWINGS

Invention features and advantages will be apparent from the detailed description which follows, taken in conjunction with the accompanying drawings, which together illustrate, by way of example, various invention embodiments; and, wherein:

FIG. 4A illustrates a top view of the electronic device package of FIG. 3 showing the layout of a heat transfer portion and an electronic component portion in accordance with an example;

FIG. 4B illustrates a bottom view of FIG. 4A;

FIG. 5A illustrates a top view of an electronic device package showing the layout of a heat transfer portion and an electronic component portion in accordance with another example;

FIG. 5B illustrates a bottom view of FIG. 5A;

Figure 1:
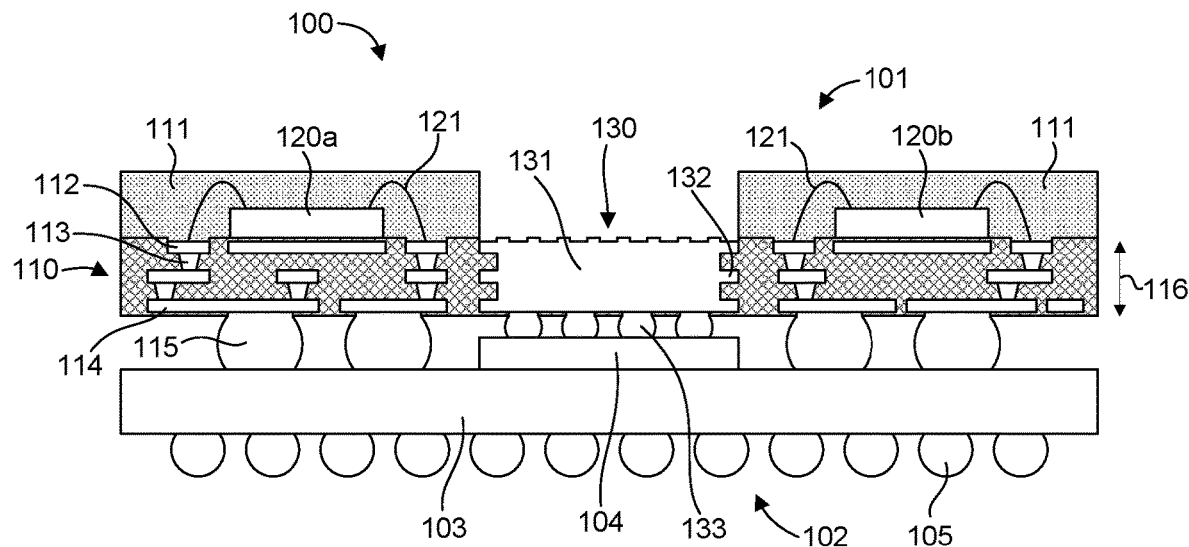
FIG. 1 illustrates a schematic cross-section of an electronic device package on package (POP) in accordance with an example.

Reference will now be made to the exemplary embodiments illustrated, and specific language will be used herein to describe the same. It will nevertheless be understood that no limitation of the scope or to specific invention embodiments is thereby intended.

DESCRIPTION OF EMBODIMENTS

Before invention embodiments are disclosed and described, it is to be understood that no limitation to the particular structures, process steps, or materials disclosed herein is intended, but also includes equivalents thereof as would be recognized by those ordinarily skilled in the relevant arts. It should also be understood that terminology employed herein is used for the purpose of describing particular examples only and is not intended to be limiting. The same reference numerals in different drawings represent the same element. Numbers provided in flow charts and processes are provided for clarity in illustrating steps and operations and do not necessarily indicate a particular order or sequence. Unless defined otherwise, all technical and scientific terms used herein have the same meaning as commonly understood by one of ordinary skill in the art to which this disclosure belongs.

As used in this written description, the singular forms "a," "an" and "the" provide express support for plural referents unless the context clearly dictates otherwise. Thus, for example, reference to "a layer" includes a plurality of such layers.

In this application, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the composition's nature or characteristics would be permissible if present under the "consisting essentially of" language, even though not expressly recited in a list of items following such terminology. When using an open ended term in the written description like "comprising" or "including," it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein. The term "coupled," as used herein, is defined as directly or indirectly connected in an electrical or nonelectrical manner. Objects described herein as being "adjacent to" each other may be in physical contact with each other, in close proximity to each other, or in the same general region or area as each other, as appropriate for the context in which the phrase is used. Occurrences of the phrase "in one embodiment," or "in one aspect," herein do not necessarily all refer to the same embodiment or aspect.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, sizes, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

Reference throughout this specification to "an example" means that a particular feature, structure, or characteristic described in connection with the example is included in at least one embodiment. Thus, appearances of the phrases "in an example" in various places throughout this specification are not necessarily all referring to the same embodiment.

Furthermore, the described features, structures, or characteristics may be combined in any suitable manner in one or more embodiments. In this description, numerous specific details are provided, such as examples of layouts, distances, network examples, etc. One skilled in the relevant art will recognize, however, that many variations are possible without one or more of the specific details, or with other methods, components, layouts, measurements, etc. In other instances, well-known structures, materials, or operations are not shown or described in detail but are considered well within the scope of the disclosure.

Example Embodiments

An initial overview of technology embodiments is provided below and specific technology embodiments are then described in further detail. This initial summary is intended to aid readers in understanding the technology more quickly but is not intended to identify key or essential features of the technology nor is it intended to limit the scope of the claimed subject matter.

Although mixed memory-logic POP stacks are in widespread use, a typical mixed memory-logic POP stack has poor thermal performance, which limits processor performance. In particular, with a memory package mounted on top of a logic package, the memory package blocks or limits the heat dissipation from the processor in the logic package and therefore limits the performance of the processor. In addition, a typical mixed memory-logic POP design has a small air gap between the processor and the memory package to accommodate manufacturing tolerances, which greatly hinders heat transfer from the processor to the memory package. This thermal constraint causes most of the heat generated by the processor to conduct through the logic package substrate and BGA and into the motherboard instead of through the memory package and plays a large part in limiting processor performance.

Accordingly, an electronic device POP is disclosed that facilitates heat transfer from a heat source in one package through another adjacent package. In one aspect, no air gap exists between the heat source and the adjacent package. In one example, a POP in accordance with the present disclosure can comprise a first electronic device package including a heat source. The POP can also comprise a second electronic device package disposed on the first electronic device package. The second electronic device package can include a substrate having a heat transfer portion proximate the heat source that facilitates heat transfer from the heat source through a thickness of the substrate. The substrate can also have an electronic component portion at least partially about the heat transfer portion that facilitates electrical communication. In addition, the POP can comprise an electronic component operably coupled to the electronic component portion.

Referring to FIG. 1, an exemplary electronic device POP 100 is schematically illustrated in cross-section. The POP 100 can include an upper or top electronic device package 101 mounted on and coupled to a lower or bottom electronic device package 102. The electronic device package 101 may be disposed (i.e., stacked) on the electronic device 102, for example, to save space on circuit board (not shown) and enable smaller form factors. In one embodiment, the electronic device package 101 can be a memory (e.g., DRAM, SRAM, FLASH, etc.) package stacked on top of the electronic device package 102, which can be a logic or processor package to form a mixed logic-memory stack.

Figure 2:
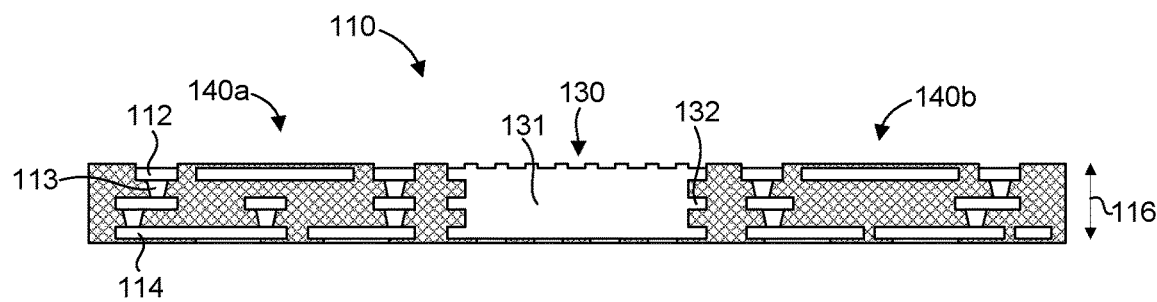
FIG. 2 illustrates a schematic cross-section of an electronic device package substrate in accordance with an example.
Figure 3:
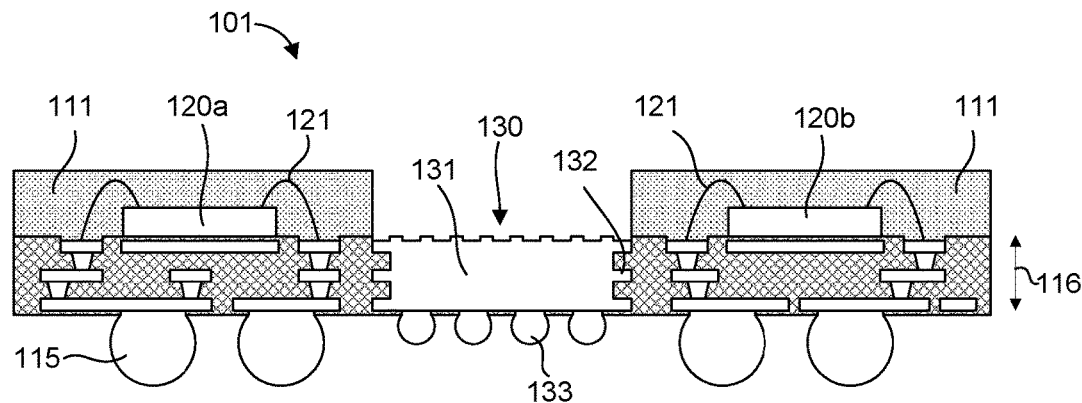
FIG. 3 illustrates a schematic cross-section of an electronic device package in accordance with an example.

The electronic device package 101 can include a substrate 110. For clarity, the substrate 110 is shown isolated in FIG. 2, and the electronic device package 101 is shown isolated in FIG. 3. FIGS. 2 and 3 are referred to along with FIG. 1 in discussing various aspects of the present technology. The electronic device package 101 can include one or more electronic components 120a, 120b operably coupled to the substrate 110. An electronic component can be any electronic device or component that may be included in an electronic device package, such as a semiconductor device (e.g., a die, a chip, a processor, computer memory, etc.). In one embodiment, each of the electronic components 120a, 120b may represent a discrete chip. The electronic components 120a, 120b may be, include, or be a part of a processor, memory, or application specific integrated circuit (ASIC) in some embodiments. Although two electronic components 120a, 120b are depicted in FIGS. 1 and 3, any suitable number of electronic components can be included. The electronic components 120a, 120b can be attached to the substrate 110 according to a variety of suitable configurations including wire bonding, a flip-chip configuration, and the like. The electronic components 120a, 120b can be electrically coupled to the substrate 110 using interconnect structures 121 (e.g., the illustrated wire bonds and/or solder balls) configured to route electrical signals between the electronic components 120a, 120b and the substrate 110. In some embodiments, the interconnect structures 121 may be configured to route electrical signals such as, for example, I/O signals and/or power or ground signals associated with the operation of the electronic components 120a, 120b. A mold compound material 111 (e.g., an epoxy) can encapsulate the electronic components 120a, 120b.

The substrate 110 may include electrical routing features configured to route electrical signals to or from the electronic components 120a, 120b. The electrical routing features may be internal and/or external to the substrate 110. For example, in some embodiments, the substrate 110 may include electrical routing features such as pads 112, vias 113, and/or traces 114 configured to receive the interconnect structures 121 and route electrical signals to or from the electronic components 120a, 120b. The pads 112, vias 113, and traces 114 can be constructed of the same or similar electrically conductive materials, or of different electrically conductive materials. Package level interconnects such as, for example, solder balls 115, may be coupled to a bottom side surface of the substrate 110 to further route the electrical signals to other electrical devices (e.g., an electronic component on the package 102) and/or to provide power.

The electronic device package 102 can include a substrate 103. The substrate can also include what is referred to generally herein as a heat source 104, which typically includes an electronic component that generates heat. For example, the heat source 103 can be a SOC or a component of such as system. The electronic device package 102 can include contacts (not shown) to electrically couple with the solder balls 115 for power and/or signaling. The electronic device package 102 can also include interconnects, such as solder balls 105, for coupling with a substrate (e.g., a circuit board such as a motherboard) for power and/or signaling.

In a typical mixed logic-memory POP stack, a heat source (e.g., a SOC) of the bottom package is insulated by the top package (e.g., the top package and an air gap between the heat source and the top package). In the POP 100, however, the electronic device package 101 can be configured to facilitate heat transfer from the heat source 104 of the electronic device package 102 and thereby facilitate cooling of the heat source 104. The substrate 110 can have a heat transfer portion 130 that facilitates heat transfer through a thickness 116 of the substrate 110. As shown in FIG. 1, the heat transfer portion 130 can be proximate the heat source 104 of the electronic device package 102. As shown in FIG. 2, the substrate 110 can also include an electronic component portion 140a, 140b positioned at least partially about the heat transfer portion 130. The electronic component portion 140a, 140b is configured to facilitate electrical communication. Therefore, the electronic component portion 140a, 140b includes the pads 112, vias 113, and/or traces 114 for electrically coupling with the electronic components 120a, 120b (see FIGS. 1 and 3). In one aspect, the electronic components 120a, 120b can be disposed on opposite sides of the heat transfer portion 130. The electronic component portion 140a, 140b also includes the solder balls 115 coupled to the bottom side of the electronic component portion 140a, 140b of the substrate 110 to facilitate electrical coupling with an electronic component, such as by coupling with the electronic device package 102. The mold compound 111 encapsulating the electronic components 120a, 120b can be disposed at least partially about a periphery of the heat transfer portion 130 such that a top side of the heat transfer portion 130 is exposed. In some embodiments, the mold compound is disposed about an entire periphery of the heat transfer portion.

With continued reference to FIGS. 1-3, FIGS. 4A and 4B illustrate top and bottom views, respectively, of the electronic device package 101 and, in particular, the layout of the heat transfer portion 130 and the electronic component portion 140a, 140b. For example, the top view in FIG. 4A shows the heat transfer portion 130 in a center of the substrate 110 and the electronic component portions 140a, 140b disposed on opposite sides of the heat transfer portion 130. The electronic components 120a, 120b are shown in the electronic component portions 140a, 140b, respectively. The bottom view in FIG. 4B shows the solder balls 115 disposed about the heat transfer portion 130 such that the solder balls 115 are on opposite sides of the heat transfer portion 130. The example configuration shown in FIGS. 4A and 4B demonstrates the substrate 110 with a suitable width to accommodate the heat transfer portion 130, which is disposed between the electronic component portions 140a, 140b.

FIGS. 5A and 5B illustrate top and bottom views, respectively, of a layout of a heat transfer portion 230 and an electronic component portion 240 of an electronic device package 201 in accordance with another example of the present disclosure. In this example, the top view in FIG. 5A shows the heat transfer portion 230 in a center of a substrate 210 and the electronic component portion 240 disposed about of the heat transfer portion 230 such that the electronic component portion 240 surrounds the heat transfer portion 230. The electronic components 220a, 220b are shown in the electronic component portion 240 such that the electronic components are disposed on opposite sides of the heat transfer portion 230. It should be recognized that additional electronic components can be disposed in the electronic component portion 240 in any suitable arrangement or configuration. The bottom view in FIG. 5B shows the solder balls 215 disposed about the heat transfer portion 230 such that the solder balls 215 surround the heat transfer portion 230. The example configuration shown in FIGS. 5A and 5B demonstrates the substrate 210 with a suitable width to accommodate the heat transfer portion 230, which is disposed between the electronic component portion 240, as well as a suitable length to accommodate the solder balls 215 surrounding the heat transfer portion 230.

Figure 6:
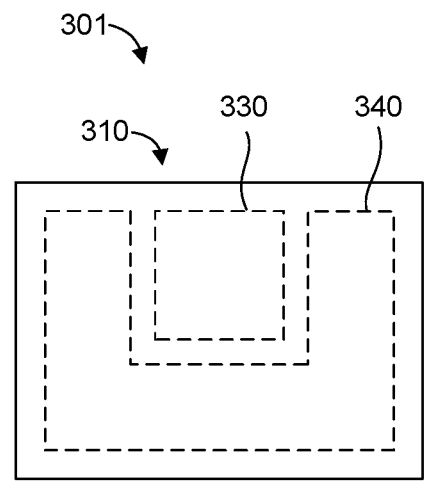
FIG. 6 illustrates a top view of an electronic device package showing the layout of a heat transfer portion and an electronic component portion in accordance with another example.
Figure 7:
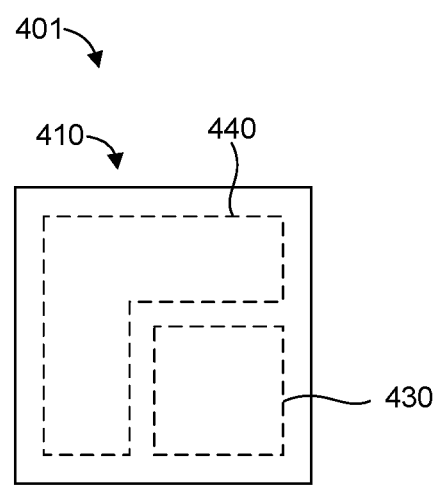
FIG. 7 illustrates a top view of an electronic device package showing the layout of a heat transfer portion and an electronic component portion in accordance with yet another example.

FIGS. 6 and 7 illustrate tops views of heat transfer portions and electronic component portions of electronic device packages in accordance with additional examples of the present disclosure. FIG. 6 illustrates an electronic device package 301 where a heat transfer portion 330 is located proximate an edge of a substrate 310. Thus, an electronic device portion 340 may only partially surround the heat transfer portion 330 about a portion of the heat transfer portion 330 periphery. FIG. 7 illustrates an electronic device package 401 where a heat transfer portion 430 is located proximate two edges (i.e., in a corner) of a substrate 410. Thus, an electronic device portion 440 may only partially surround the heat transfer portion 430 about a portion of the heat transfer portion 430 periphery.

Referring again to FIGS. 1-3, in one aspect, a thermal conductivity of the heat transfer portion 130 can be configured to facilitate thermal conduction through the thickness 116 of the substrate 110, such as by being made primarily of a thermally conductive material 131. For example, the heat transfer portion 130 can comprise a metal material, such as copper, aluminum, and/or iron in pure and/or alloyed forms, although these materials are not meant to be limiting. For example, the heat transfer portion 130 can include alternating layers of pure copper and beryllium copper in alternating layers and/or adjacent blocks. On the other hand, the electronic component portion 140a, 140b can be made primarily of typical substrate materials, which tend to be thermally insulating. In one embodiment, the electronic component portion 140a, 140b can be made primarily of an epoxy-based laminate substrate having a core and/or build-up layers. The electronic component portion 140a, 140b of the substrate 110 may include other suitable types of substrates in other embodiments. For example, the electronic component portion 140a, 140b can be formed primarily of any suitable semiconductor material (e.g., a silicon, gallium, indium, germanium, or variations or combinations thereof, among other substrates), one or more insulating layers, such as glass-reinforced epoxy, such as FR-4, polytetrafluoroethylene (Teflon), cotton-paper reinforced epoxy (CEM-3), phenolic-glass (G3), paper-phenolic (FR-1 or FR-2), polyester-glass (CEM-5), ABF (Ajinomoto Build-up Film), any other dielectric material, such as glass, or any combination thereof, such as can be used in printed circuit boards (PCBs). Although the electronic component portion 140a, 140b of the substrate 110 includes pads 112, vias 113, and/or traces 114 that may be made of thermally conductive materials, these features are relatively small and offer few thermal conduits through the thickness 116 of the substrate 110. Thus, the electronic component portion 140a, 140b is dominated by materials with thermal insulating properties. The result in some embodiments, therefore, is that a thermal conductivity of the heat transfer portion 130 is greater than a thermal conductivity of the electronic component portion 140a, 140b, the electronic components 120a, 120b, and/or the mold compound 111.

The thermally conductive material 131, such as metal, can be incorporated into the substrate 110 in any suitable manner and can have any suitable configuration. For example, the thermally conductive material 131 can be arranged in a grid configuration, a block configuration, or any other suitable configuration to provide a heat path or conduit through the thickness 116 of the substrate 110. Such grid or block configurations can be achieved by any suitable process, such as a deposition process (e.g., electrolytic deposition, electroless deposition, etc.), a mold process, an extrusion process, a machining process, a casting process, and/or any other suitable additive manufacturing process and/or material removal process. In one aspect, the thermally conductive material 131 can be incorporated into the substrate 110 layer by layer as other layers of the substrate 110 are built up. In another aspect, the substrate 110 can include an opening configured to receive thermally conductive material 121 and the thermally conductive material 131 can be disposed in the opening at a suitable stage of manufacture. The thermally conductive material 131 can be secured in the substrate 110 in any suitable manner, such as by mechanical interference and/or an adhesive. For example, the thermally conductive material 131 can include tabs or blocks 132 that extend into surrounding substrate material (e.g., thermally insulative material) to mechanically couple the thermally conductive material 131 to other portions of the substrate 110. Such tabs or blocks 132 can be formed in a layer by layer build up process of the substrate 110. In one aspect, the thermally conductive material 131 can be solid throughout an interior of the heat transfer portion 130. In another aspect, thermally insulative material can be included in the heat transfer portion 130, such as interspersed throughout an interior of the heat transfer portion 130 in a grid pattern. Inclusion of thermally insulative material in the heat transfer portion 130 may result from a layer by layer build up manufacturing process of the substrate 110.

In a typical mixed logic-memory POP stack that has a memory package disposed on a logic package, there is an air gap between the processor (e.g., a SOC) and the memory package to accommodate manufacturing tolerances, which hinders heat conduction from the processor to the memory package and instead causes most of the heat generated by the processor to conduct through the logic package substrate and BGA into the motherboard. This thermal constraint is a large factor in limiting performance. The POP 100 can eliminate such an air gap between the packages 101, 102, while facilitating conduction from the package 101 to the package 102 via the heat transfer portion 130 (e.g., the thermally conductive material 131) of the substrate 110. For example, solder balls 133 can be coupled to a bottom side of the heat transfer portion 130 to facilitate thermal coupling with the heat source 104.

Figure 8:
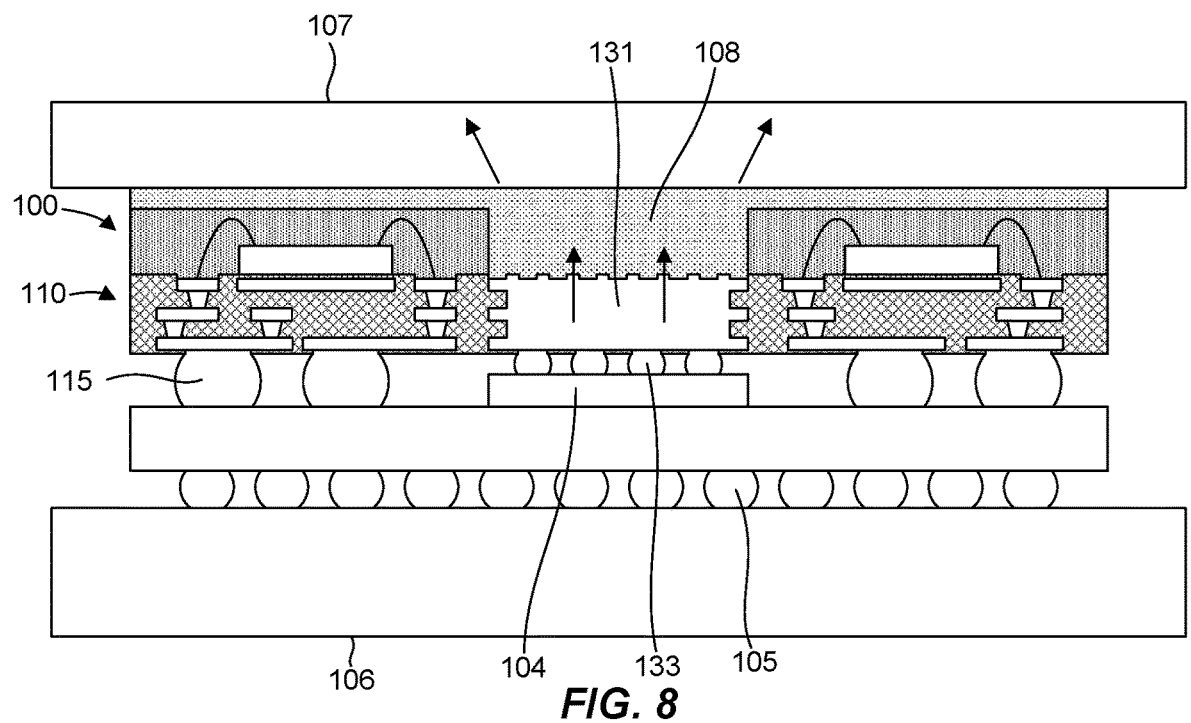
FIG. 8 illustrates a schematic cross-section of the POP of FIG. 1 mounted on a motherboard and thermally coupled to a thermal solution component for cooling the POP in accordance with an example.

In one aspect, the top side of the heat transfer portion 130 can be exposed, such as to facilitate thermally coupling with a thermal solution system or component (e.g., a heat spreader, a heat sink, etc.). For example, FIG. 8 illustrates the POP 100 mounted on a motherboard 106 and thermally coupled to a thermal solution component 107 for cooling the POP 100. Thermal interface material (TIM) 108 can be disposed between the POP 100 and the thermal solution component 107. In particular, the TIM 108 can be in contact with the exposed top side of the thermally conductive material 131 of the heat transfer portion 130 and with the thermal solution component 107. The illustrated configuration provides a path or channel of relatively high thermal conductivity from the heat source 104 through the solder balls 133, the thermally conductive material 131, and the TIM 108 to the thermal solution component 107. This heat transfer path can provide superior heat dissipation from the heat source 104 compared to a typical POP stack configuration, while also minimizing the XY footprint of the electronic device packages 101, 102. The solder ball material can be selected to optimize heat transfer from the heat source 104 to the heat transfer portion 131. In one aspect, epoxy can be disposed about the solder balls 133 to further facilitate thermal conduction between the heat source 104 and the heat transfer portion 131, since epoxy has a higher conductivity than air. In some embodiments, the principles disclosed herein can provide about a 5× improvement in thermal performance over that of a typical POP stack configuration. In one aspect, the presence of the thermally conductive material 131 in the substrate 100 can facilitate the spread of heat more uniformly across the heat source 104, which can improve cooling of the heat source 104. The principles disclosed herein can provide electronic device packages that are not thermally limited in the steady state regime and can provide for higher transient power dissipation. In addition, a POP as disclosed herein can provide for the flexibility of high thermal performance in docked environments without sacrificing board area and battery capacity for a memory down layout.

Although the top side or surface of the thermally conductive material 131 is illustrated as being about even with the surrounding substrate material, it should be recognized that the top side or surface of the thermally conductive material 131 can be at least partially recessed relative to the surrounding substrate material and/or at least partially elevated relative to the surrounding substrate material. For example, the thermally conductive material 131 can extend above the surrounding substrate material and be about even with the top surface of the mold compound material 121 (e.g., providing a flat top surface of the package 101). This configuration can provide the thermally conductive material through substantially an entire thickness of the package 101 and reduce the amount of TIM 108.

Although the heat transfer portion 130 has been discussed with regard to having a thermally conductive material, it should be recognized that a heat transfer portion can be configured to facilitate heat transfer in any suitable manner with any suitable structure or configuration. For example, the instead of a thermally conductive material, a heat transfer portion can have an opening or hollow void extending at least partially through the thickness of the substrate. This opening can be filled at least partially by TIM and/or receive a portion of a thermal solution component.

Due to the heat transfer portion 130 of the top package 101, the XY dimension of the top package 101 and, in some embodiments, the bottom package 102 may be increased relative to that of a comparable typical POP. As a result, the bailout configuration on the top package 101 (i.e., for the solder balls 115) may be wider than that of a comparable typical POP. In one aspect, a POP as disclosed herein can accommodate a bailout configuration on the top package that is the same or similar to a corresponding bailout configuration of a typical POP stack.

Figure 9:
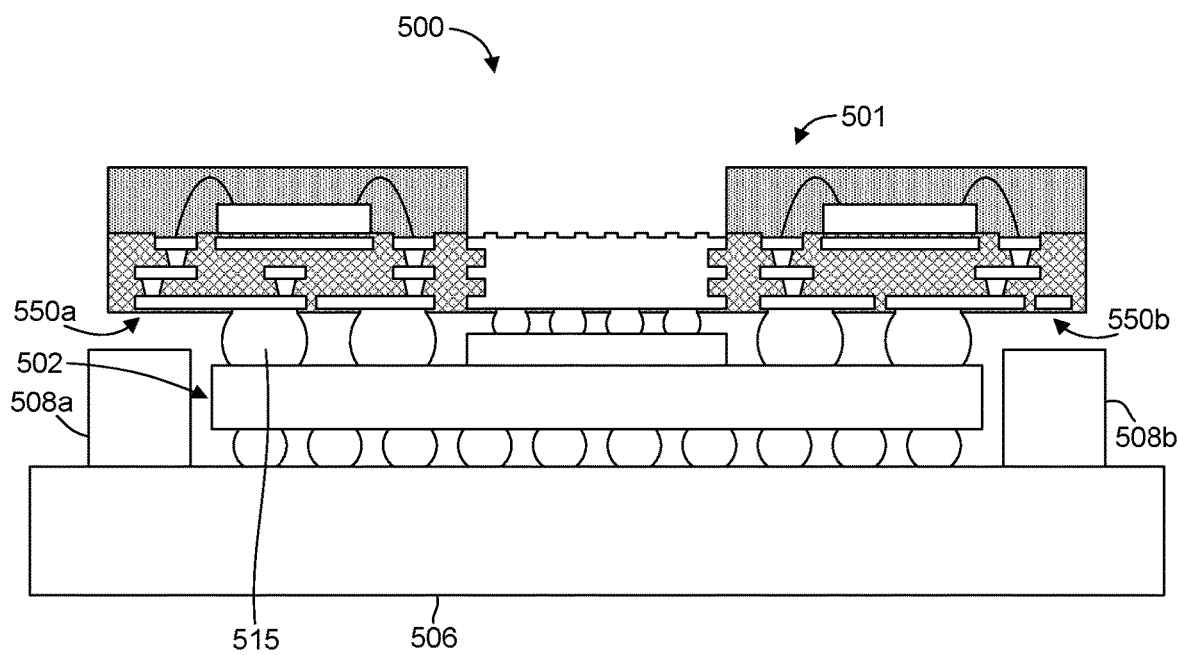
FIG. 9 illustrates a schematic cross-section of an electronic device POP in accordance with another example.

This is illustrated in FIG. 9 with respect to a POP 500 in accordance with another example of the present disclosure. As with the POP 100 described above, the POP 500 includes electronic device packages 501, 502, which are generally the same as the electronic device packages 101, 102, respectively. In this case, the bottom package 502 is sized similar to that of a corresponding package of a typical POP stack. Thus, the bailout configuration of the top package 501 (i.e., for solder balls 515) can be configured to facilitate an interface with the bottom package 502. With the difference in the size of the packages 501, 502, the top package 501 can have overhang portions 550a, 550b that extend beyond lateral sides of the bottom package 502. This overhang configuration may not result in any loss of real estate on the circuit board 506 because low profile electrical components 508a, 508b (e.g., passive components such as capacitors) can be located at least partially beneath the overhang portions 550a, 550b.

Figure 10:
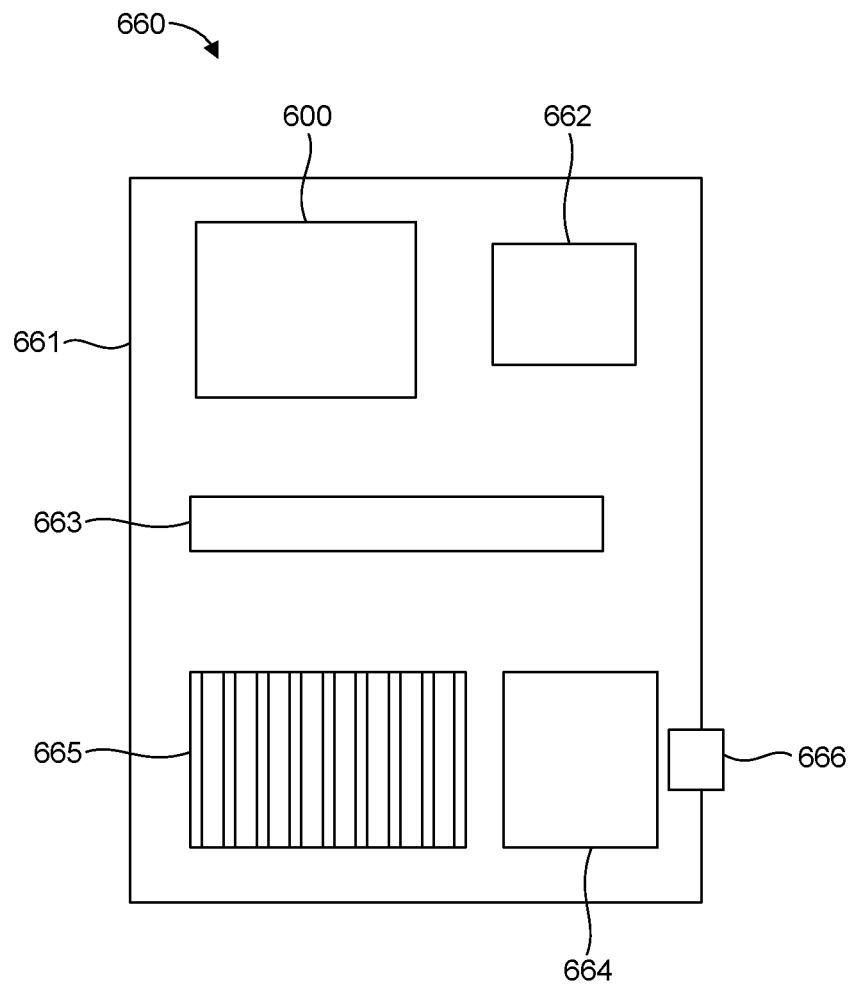
FIG. 10 is a schematic illustration of an exemplary computing system.

FIG. 10 schematically illustrates an example computing system 660. The computing system 660 can include an electronic device POP 600 as disclosed herein, coupled to a motherboard 661. In one aspect, the computing system 660 can also include a processor 662, a memory device 663, a radio 664, a cooling system (e.g., a heat sink and/or a heat spreader) 665, a port 666, a slot, or any other suitable device or component, which can be operably coupled to the motherboard 661. The cooling system 665 can be in thermal communication with a heat transfer portion of the POP 600. The computing system 660 can comprise any type of computing system, such as a desktop computer, a laptop computer, a tablet computer, a smartphone, a server, a wearable electronic device, etc. Other embodiments need not include all of the features specified in FIG. 10, and may include alternative features not specified in FIG. 10.

EXAMPLES

The following examples pertain to further embodiments.

In one example there is provided a substrate comprising a heat transfer portion that facilitates heat transfer through a thickness of the substrate, and an electronic component portion at least partially about the heat transfer portion that facilitates electrical communication.

In one example of a substrate, a thermal conductivity of the heat transfer portion is greater than a thermal conductivity of the electronic component portion.

In one example of a substrate, the electronic component portion comprises at least two electronic component portions disposed on opposite sides of the heat transfer portion.

In one example of a substrate, the electronic component portion comprises an electrical trace to facilitate electrical communication.

In one example of a substrate, the heat transfer portion comprises a metal material.

In one example of a substrate, the metal material is arranged in a grid configuration.

In one example of a substrate, the metal material is arranged in a block configuration.

In one example of a substrate, the metal material comprises copper, aluminum, iron, or a combination thereof.

In one example of a substrate, a top side of the heat transfer portion is exposed.

In one example of a substrate, the substrate comprises a solder ball coupled to a bottom side of the heat transfer portion to facilitate thermal coupling with a heat source.

In one example of a substrate, the substrate comprises a solder ball coupled to a bottom side of the electronic component portion to facilitate electrical coupling with an electronic component.

In one example there is provided an electronic device package comprising a substrate having a heat transfer portion that facilitates heat transfer through a thickness of the substrate, and an electronic component portion at least partially about the heat transfer portion that facilitates electrical communication, and an electronic component operably coupled to the electronic component portion.

In one example of an electronic device package, a thermal conductivity of the heat transfer portion is greater than a thermal conductivity of at least one of the electronic component portion and the electronic component.

In one example of an electronic device package, the electronic component comprises at least two electronic components disposed on opposite sides of the heat transfer portion.

In one example of an electronic device package, the electronic component portion comprises an electrical trace to facilitate electrical communication.

In one example of an electronic device package, the heat transfer portion comprises a metal material.

In one example of an electronic device package, the metal material is arranged in a grid configuration.

In one example of an electronic device package, the metal material is arranged in a block configuration.

In one example of an electronic device package, the metal material comprises copper, aluminum, iron, or a combination thereof.

In one example of an electronic device package, a top side of the heat transfer portion is exposed.

In one example of an electronic device package, the electronic device package comprises a solder ball coupled to a bottom side of the heat transfer portion to facilitate thermal coupling with a heat source.

In one example of an electronic device package, the electronic device package comprises a solder ball coupled to a bottom side of the electronic component portion to facilitate electrical coupling with a second electronic component.

In one example of an electronic device package, the electronic component comprises computer memory.

In one example of an electronic device package, the electronic device package comprises a mold compound encapsulating the electronic component.

In one example of an electronic device package, the mold compound is disposed at least partially about a periphery of the heat transfer portion such that a top side of the heat transfer portion is exposed.

In one example of an electronic device package, the mold compound is disposed about an entire periphery of the heat transfer portion.

In one example there is provided an electronic device package on package (POP) comprising a first electronic device package including a heat source, and a second electronic device package disposed on the first electronic device package, the second electronic device package including a substrate having a heat transfer portion proximate the heat source that facilitates heat transfer from the heat source through a thickness of the substrate, and an electronic component portion at least partially about the heat transfer portion that facilitates electrical communication, and an electronic component operably coupled to the electronic component portion.

In one example of a POP, a thermal conductivity of the heat transfer portion is greater than a thermal conductivity of at least one of the electronic component portion and the electronic component.

In one example of a POP, the electronic component comprises at least two electronic components disposed on opposite sides of the heat transfer portion.

In one example of a POP, the electronic component portion comprises an electrical trace to facilitate electrical communication.

In one example of a POP, the heat transfer portion comprises a metal material.

In one example of a POP, the metal material is arranged in a grid configuration.

In one example of a POP, the metal material is arranged in a block configuration.

In one example of a POP, the metal material comprises copper, aluminum, iron, or a combination thereof.

In one example of a POP, a top side of the heat transfer portion is exposed.

In one example of a POP, the POP comprises a solder ball coupled to a bottom side of the heat transfer portion to facilitate thermal coupling with a heat source.

In one example of a POP, the POP comprises a solder ball coupled to a bottom side of the electronic component portion to facilitate electrical coupling with a second electronic component.

In one example of a POP, the electronic component comprises computer memory.

In one example of a POP, the POP comprises a mold compound encapsulating the electronic component.

In one example of a POP, the mold compound is disposed at least partially about a periphery of the heat transfer portion such that a top side of the heat transfer portion is exposed.

In one example of a POP, the mold compound is disposed about an entire periphery of the heat transfer portion.

In one example of a POP, the electronic component comprises computer memory.

In one example of a POP, the heat source comprises a processor.

In one example of a POP, the second electronic device package includes an overhang portion that extends beyond a lateral side of the first electronic device package.

In one example there is provided a computing system comprising a motherboard, and an electronic device package on package (POP) operably coupled to the motherboard, the POP having a first electronic device package including a heat source, and a second electronic device package disposed on the first electronic device package, the second electronic device package including a substrate having a heat transfer portion proximate the heat source that facilitates heat transfer from the heat source through a thickness of the substrate, and an electronic component portion at least partially about the heat transfer portion that facilitates electrical communication, and an electronic component operably coupled to the electronic component portion.

In one example of a computing system, the computing system comprises a cooling system in thermal communication with the heat transfer portion.

In one example of a computing system, the cooling system comprises a heat spreader.

In one example of a computing system, the computing system comprises a desktop computer, a laptop, a tablet, a smartphone, a server, a wearable electronic device, or a combination thereof.

In one example of a computing system, the computing system comprises a processor, a memory device, a heat sink, a radio, a slot, a port, or a combination thereof operably coupled to the motherboard.

In one example there is provided a method for facilitating heat transfer from a heat source comprising providing a substrate having a heat transfer portion that facilitates heat transfer through a thickness of the substrate, and an electronic component portion at least partially about the heat transfer portion that facilitates electrical communication, and facilitating thermal coupling of the heat transfer portion with a heat source.

In one example of a method for facilitating heat transfer from a heat source, a thermal conductivity of the heat transfer portion is greater than a thermal conductivity of at least one of the electronic component portion and the electronic component.

In one example of a method for facilitating heat transfer from a heat source, the electronic component comprises at least two electronic components disposed on opposite sides of the heat transfer portion.

In one example of a method for facilitating heat transfer from a heat source, the electronic component portion comprises an electrical trace to facilitate electrical communication.

In one example of a method for facilitating heat transfer from a heat source, the heat transfer portion comprises a metal material.

In one example of a method for facilitating heat transfer from a heat source, the metal material is arranged in a grid configuration.

In one example of a method for facilitating heat transfer from a heat source, the metal material is arranged in a block configuration.

In one example of a method for facilitating heat transfer from a heat source, the metal material comprises copper, aluminum, iron, or a combination thereof.

In one example of a method for facilitating heat transfer from a heat source, a top side of the heat transfer portion is exposed.

In one example of a method for facilitating heat transfer from a heat source, a solder ball is coupled to a bottom side of the heat transfer portion to facilitate thermal coupling with a heat source.

In one example of a method for facilitating heat transfer from a heat source, a solder ball is coupled to a bottom side of the electronic component portion to facilitate electrical coupling with a second electronic component.

In one example of a method for facilitating heat transfer from a heat source, the electronic component comprises computer memory.

In one example of a method for facilitating heat transfer from a heat source, a mold compound is encapsulating the electronic component.

In one example of a method for facilitating heat transfer from a heat source, the mold compound is disposed at least partially about a periphery of the heat transfer portion such that a top side of the heat transfer portion is exposed.

In one example of a method for facilitating heat transfer from a heat source, the mold compound is disposed about an entire periphery of the heat transfer portion.

In one example of a method for facilitating heat transfer from a heat source, the electronic component comprises computer memory.

In one example of a method for facilitating heat transfer from a heat source, the heat source comprises a processor.

In one example of a method for facilitating heat transfer from a heat source, the second electronic device package includes an overhang portion that extends beyond a lateral side of the first electronic device package.

In one example of a method for facilitating heat transfer from a heat source, the method comprises providing an electronic component operably coupled to the electronic component portion.

In one example there is provided a method for making a substrate comprising forming a heat transfer portion of a substrate that facilitates heat transfer through a thickness of the substrate, and forming an electronic component portion of the substrate at least partially about the heat transfer portion that facilitates electrical communication.

In one example there is provided a method for making an electronic device package comprising obtaining a substrate having a heat transfer portion that facilitates heat transfer through a thickness of the substrate, and an electronic component portion at least partially about the heat transfer portion that facilitates electrical communication, and coupling an electronic component to the electronic component portion.

In one example there is provided a method for making an electronic device package on package (POP) comprising obtaining a first electronic device package comprising a heat source, obtaining a second electronic device package, the second electronic device package including a substrate having a heat transfer portion that facilitates heat transfer through a thickness of the substrate, and an electronic component portion at least partially about the heat transfer portion that facilitates electrical communication, and an electronic component operably coupled to the electronic component portion, and disposing the second electronic device package on the first electronic device package, wherein the heat transfer portion is proximate the heat source.

Circuitry used in electronic components or devices (e.g. a die) of an electronic device package can include hardware, firmware, program code, executable code, computer instructions, and/or software. Electronic components and devices can include a non-transitory computer readable storage medium which can be a computer readable storage medium that does not include signal. In the case of program code execution on programmable computers, the computing devices recited herein may include a processor, a storage medium readable by the processor (including volatile and non-volatile memory and/or storage elements), at least one input device, and at least one output device. Volatile and non-volatile memory and/or storage elements may be a RAM, EPROM, flash drive, optical drive, magnetic hard drive, solid state drive, or other medium for storing electronic data. Node and wireless devices may also include a transceiver module, a counter module, a processing module, and/or a clock module or timer module. One or more programs that may implement or utilize any techniques described herein may use an application programming interface (API), reusable controls, and the like. Such programs may be implemented in a high level procedural or object oriented programming language to communicate with a computer system. However, the program(s) may be implemented in assembly or machine language, if desired. In any case, the language may be a compiled or interpreted language, and combined with hardware implementations.

While the forgoing examples are illustrative of the specific embodiments in one or more particular applications, it will be apparent to those of ordinary skill in the art that numerous modifications in form, usage and details of implementation can be made without departing from the principles and concepts articulated herein.

What is claimed is:
1. A substrate, comprising:
 a heat transfer portion that facilitates heat transfer through a thickness of the substrate, the heat transfer portion having a footprint and having a widest width;

a heat source coupled directly to the heat transfer portion by one or more solder balls, the heat source having a footprint, wherein the footprint of the heat transfer portion is at least as large as the footprint of the heat source;

an electronic component portion at least partially about the heat transfer portion that facilitates electrical communication, the electronic component portion laterally adjacent to the widest width of the heat transfer portion; and a dielectric material laterally adjacent to the widest width of the heat transfer portion and laterally adjacent to the electronic component portion, the dielectric material having an uppermost surface at a same level as an uppermost surface of the heat transfer portion.

2. The substrate of claim 1, wherein a thermal conductivity of the heat transfer portion is greater than a thermal conductivity of the electronic component portion.

3. The substrate of claim 1, wherein the electronic component portion comprises at least two electronic component portions disposed on opposite sides of the heat transfer portion.

4. The substrate of claim 1, wherein the electronic component portion comprises an electrical trace to facilitate electrical communication.

5. The substrate of claim 1, wherein the heat transfer portion comprises a metal material.

6. The substrate of claim 1, wherein a top side of the heat transfer portion is exposed.

7. The substrate of claim 1, further comprising a solder ball coupled to a bottom side of the electronic component portion to facilitate electrical coupling with an electronic component.

8. An electronic device package, comprising:
a substrate having:
a heat transfer portion that facilitates heat transfer through a thickness of the substrate, the heat transfer portion having a footprint and having a widest width, a heat source coupled directly to the heat transfer portion by one or more solder balls, the heat source having a footprint, wherein the footprint of the heat transfer portion is at least as large as the footprint of the heat source, an electronic component portion at least partially about the heat transfer portion that facilitates electrical communication, the electronic component portion laterally adjacent to the widest width of the heat transfer portion; and a dielectric material laterally adjacent to the widest width of the heat transfer portion and laterally adjacent to the electronic component portion, the dielectric material having an uppermost surface at a same level as an uppermost surface of the heat transfer portion; and an electronic component operably coupled to the electronic component portion.

9. The electronic device package of claim 8, wherein a thermal conductivity of the heat transfer portion is greater than a thermal conductivity of at least one of the electronic component portion and the electronic component.

10. The electronic device package of claim 8, wherein the electronic component comprises at least two electronic components disposed on opposite sides of the heat transfer portion.

11. The electronic device package of claim 8, wherein the electronic component portion comprises an electrical trace to facilitate electrical communication.

12. The electronic device package of claim 8, wherein the heat transfer portion comprises a metal material.

13. The electronic device package of claim 8, wherein a top side of the heat transfer portion is exposed.

14. The electronic device package of claim 8, further comprising a solder ball coupled to a bottom side of the electronic component portion to facilitate electrical coupling with a second electronic component.

15. The electronic device package of claim 8, wherein the electronic component comprises computer memory.

16. The electronic device package of claim 8, further comprising a mold compound encapsulating the electronic component.

17. A method for facilitating heat transfer from a heat source, comprising:
providing a substrate having:
a heat transfer portion that facilitates heat transfer through a thickness of the substrate, the heat transfer portion having a footprint and having a widest width, a heat source coupled directly to the heat transfer portion by one or more solder balls, the heat source having a footprint, wherein the footprint of the heat transfer portion is at least as large as the footprint of the heat source, an electronic component portion at least partially about the heat transfer portion that facilitates electrical communication, the electronic component portion laterally adjacent to the widest width of the heat transfer portion; and a dielectric material laterally adjacent to the widest width of the heat transfer portion and laterally adjacent to the electronic component portion, the dielectric material having an uppermost surface at a same level as an uppermost surface of the heat transfer portion; and facilitating thermal coupling of the heat transfer portion with the heat source.

18. The method of claim 17, further comprising providing an electronic component operably coupled to the electronic component portion.

19. An electronic device package, comprising:
a substrate having:
a heat transfer portion that facilitates heat transfer through a thickness of the substrate, the heat transfer portion having a footprint and having a widest width, a heat source coupled directly to the heat transfer portion by one or more solder balls, the heat source having a footprint, wherein the footprint of the heat transfer portion is at least as large as the footprint of the heat source, an electronic component portion at least partially about the heat transfer portion that facilitates electrical communication, the electronic component portion laterally adjacent to the widest width of the heat transfer portion; and a dielectric material laterally adjacent to the widest width of the heat transfer portion and laterally adjacent to the electronic component portion; and an electronic component operably coupled to the electronic component portion, wherein the electronic component comprises computer memory.

* * * * *